(12) United States Patent
Lanzillo et al.

(10) Patent No.: US 12,740,398 B2
(45) Date of Patent: Sep. 15, 2026

(54) INTERCONNECT LEVELS WITH MULTIPLE LINE TYPES

(71) Applicant: International Business Machines Corporation, Armonk, NY (US)

(72) Inventors: Nicholas Anthony Lanzillo, Wynantskill, NY (US); Lawrence A. Clevenger, Saratoga Springs, NY (US); Brent A. Anderson, Jericho, VT (US); Ruilong Xie, Niskayuna, NY (US); Albert M. Chu, Nashua, NH (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 493 days.

(21) Appl. No.: 18/334,414

(22) Filed: Jun. 14, 2023

(65) Prior Publication Data

US 2024/0421079 A1 Dec. 19, 2024

(51) Int. Cl.
*H01L 23/528* (2006.01)
*H10W 20/00* (2026.01)
(Continued)

(52) U.S. Cl.
CPC ....... *H10W 20/435* (2026.01); *H10W 20/023* (2026.01); *H10W 20/056* (2026.01);
(Continued)

(58) Field of Classification Search
CPC ........... H01L 23/5283; H01L 21/76816; H01L 21/76883; H01L 21/76898; H01L 23/481; H01L 23/5226; H10W 20/435; H10W 20/20; H10W 20/42; H10W 20/023; H10W 20/056; H10W 20/089
See application file for complete search history.

(56) References Cited

U.S. PATENT DOCUMENTS 9,240,346 B2 1/2016 Lee
9,502,350 B1 11/2016 Bonilla et al.
(Continued)

OTHER PUBLICATIONS

International Searching Authority, "Notification of Transmittal of the International Search Report and the Written Opinion of the International Searching Authority, or Declaration," Patent Cooperation Treaty, Sep. 6, 2024, 13 pages, International Application No. PCT/EP2024/063619.
(Continued)

*Primary Examiner* — Dale E Page
*Assistant Examiner* — Colleen E Snow
(74) *Attorney, Agent, or Firm* — Edward J. Wixted, III

(57) ABSTRACT

A semiconductor structure with a first backside metal level that has a plurality of first type of lines and at least one second type line. The first type of lines have a wider top surface than the bottom surface and have a first width. The first type of lines each connect by a first via to a second backside metal level. Each of first type of lines and the second type line connect by a second via to a through-silicon via. The second type line is narrower than the first type of lines. Each of the second type line is between adjacent first type of lines. The second type line has a top surface that is in the middle of the first type of lines, below the first type of lines, above, or level with the top surface of the first type of lines.

25 Claims, 7 Drawing Sheets

(51) Int. Cl.
*H10W 20/20* (2026.01)
*H10W 20/41* (2026.01)
*H10W 20/42* (2026.01)

(52) U.S. Cl.
CPC ......... *H10W 20/089* (2026.01); *H10W 20/20* (2026.01); *H10W 20/42* (2026.01)

(56) References Cited

U.S. PATENT DOCUMENTS

| | | | | |
|---|---|---|---|---|
| 10,002,786 | B1 | 6/2018 | Licausi | |
| 10,256,186 | B2 | 4/2019 | Bonilla | |
| 10,515,894 | B2 | 12/2019 | Briggs | |
| 11,374,005 | B2 | 6/2022 | Peng | |
| 2020/0411427 | A1 | 12/2020 | Lin | |
| 2021/0391421 | A1 | 12/2021 | Chu | |
| 2022/0045003 | A1* | 2/2022 | Bae | H10W 20/435 |
| 2022/0284164 | A1 | 9/2022 | Peng | |
| 2023/0103023 | A1 | 3/2023 | Wagner et al. | |
| 2023/0146512 | A1 | 5/2023 | Lanzillo et al. | |

OTHER PUBLICATIONS

Intellectual Property Office, "Request for the Submission of an Opinion," Feb. 20, 2026, 27 Pages, KR Application No. 10-2025-7017033.

* cited by examiner

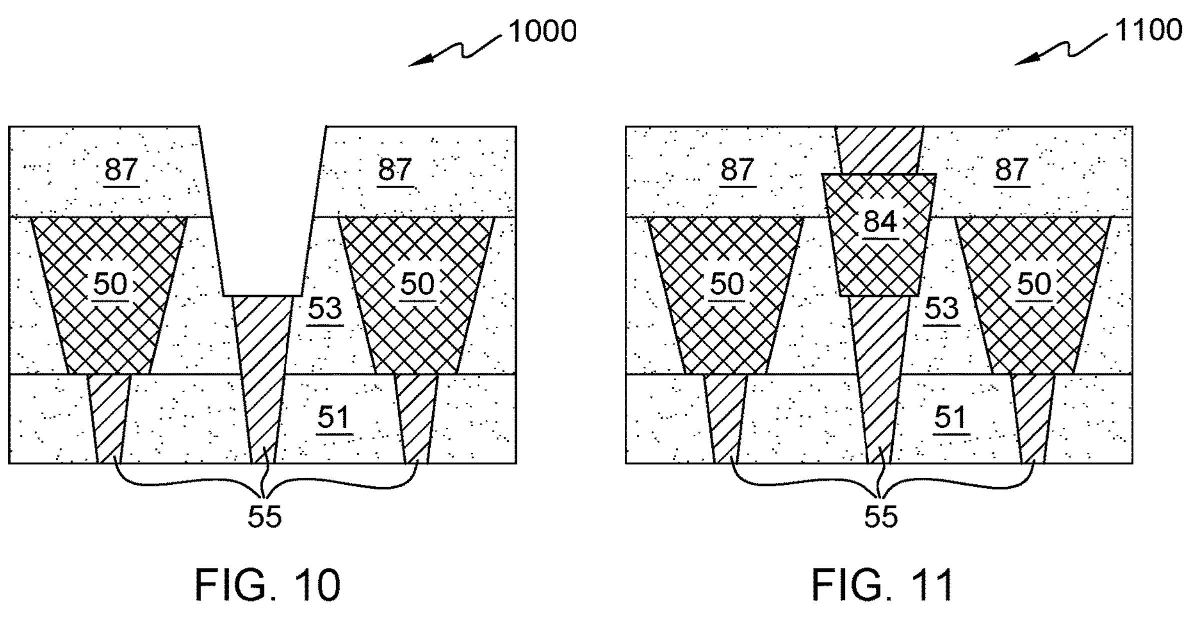
FIG. 10
FIG. 11
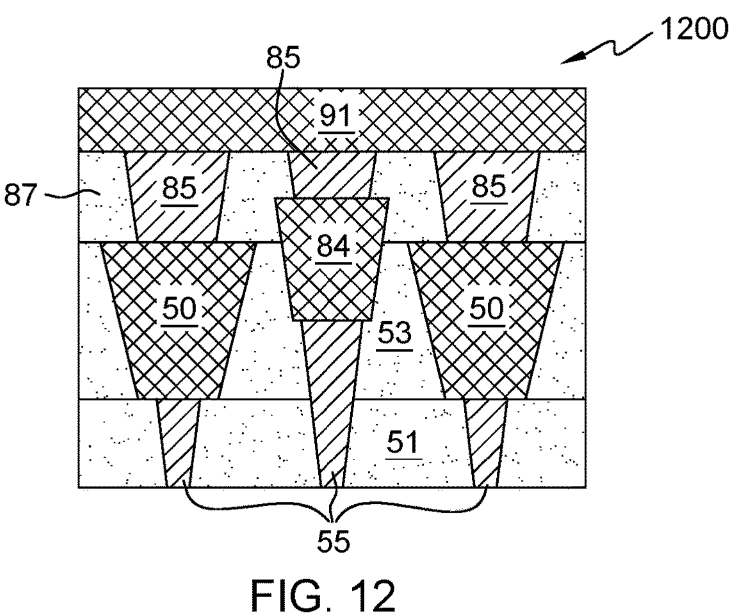
FIG. 12

INTERCONNECT LEVELS WITH MULTIPLE LINE TYPES

BACKGROUND

The present invention relates generally to the field of semiconductor device manufacture and more particularly to the formation of two types of lines in a metal level using damascene processes.

According to Moore's Law, the number of transistors in a semiconductor chip approximately doubles every two years, driving smaller and smaller transistors and smaller connections between the transistors. One of the drivers for semiconductor chip complexity and computing system functionality is the increasing use of artificial intelligence with deep neural networks that require more device circuits and faster processing speeds. Semiconductor chip designs are continually packaging more circuits into semiconductor chips and as a result, the line widths and the space between adjacent device elements within the semiconductor chip continues to shrink to support the increasing computer system functionality requirements. As the transistors and the interconnect wires become smaller, the transistors and interconnect wiring in the semiconductor chips are more resistive and use more power.

Additionally, advances in semiconductor chip process technology and digital system architecture have led to integrated circuits having increased operating frequencies. Higher operating frequencies typically result in undesirable increases in power consumption in the semiconductor chips. Typically, power consumption is a significant problem for semiconductor chips, and, in particular, for large scale, complex, high-speed processors and microprocessors. As increasing operating frequencies and increasing number of device circuits with faster processing speeds are needed, the power delivery networks in semiconductor chips need to provide more power without significantly impacting the ability to provide desired electrical performance and the required device circuits with interconnect wiring.

Typically, semiconductor devices, such as transistors are formed in front side metal layers in the semiconductor chip and are connected by layers of interconnects and power structures formed in the front side metal layers above the transistors. In traditional semiconductor chip design, the power delivery network is formed by conductor lines and vias in the front side metal layers and is connected to VDD/VSS terminals of the semiconductor chip to deliver power to the individual devices or transistors in the front side of the semiconductor chip. Conventional power rails in a traditional power delivery network typically reside with the memory devices and in the interconnect layers above the transistors in the core logic areas of the semiconductor chip where the power rails connect to the power and ground terminals of the transistors. Conventional power rails in the front side metal interconnect layers of the semiconductor chip utilize a significant amount of semiconductor wiring area and limit semiconductor wiring that could be available for other purposes, such as, signal routing, clock and input/output (I/O). In some semiconductor structures, power delivery networks are being formed on the backside of the semiconductor substrate thereby allowing more flexibility for wiring resources on the front side of the semiconductor substrate for signal routing, clock, and I/O.

SUMMARY

Embodiments of the present invention provide a plurality of first type of lines in a first metal level with a first line width and a first height, where each line of the plurality of first type of lines has a wider top surface than a bottom surface and a second type line in the first metal level with a second line width that is narrower than the first line width in the first metal level. The second type line is between adjacent first type of lines, and wherein the second type line has the wider top surface than the bottom surface.

Embodiments of the present invention disclose a semiconductor structure including a first backside metal level that has a plurality of first type of lines and at least one second type line, where the first type of lines have a wider line top surface than bottom surface and have a first width and a first height. The first type of lines each connect by a first via to a second backside metal level that is below the first backside metal level. The first via of a group of first vias are below and contact the first metal level. Embodiments of the present invention disclose that each of first type of lines connect by a second via to one of a through-silicon via in a thinned semiconductor substrate when connecting the first type of lines to the front side interconnect wiring or to a metal level that is closer to the backside of the semiconductor substrate. The second vias are above and contacting the first metal level. Embodiments of the present invention also disclose the first type of lines in one or more of backside metal levels that connect vias to the backside metal levels above and below the metal level with the first type of lines.

The second type line in the first backside metal level with a wider top surface than a bottom surface has a second width that is narrower than the width of the first type of lines. Each of the second type line is between adjacent first type of lines and has one of the same height as the first type of lines. The second type line each connect by one of the first vias to the second backside metal level. The second type line has a top surface that is one of: above a top surface of the first type of lines, level with the top surface of the first type of lines, in the middle of the first type of lines, or below the top surface of the first type of lines. Embodiments of the present invention also disclose the second type lines in one or more of backside metal levels that connect vias to the backside metal levels above and below the metal level with the first type of lines Embodiments of the present invention provide a first backside metallization level that has a plurality of first type of lines and at least one second type line. The first type of lines with a wider line top surface than a line bottom surface each have a first width and a first height. The first type of lines each connect by a first via to a second backside metallization level. The second type of line with the wider line top surface than the line bottom surface has a second width that is narrower than the first width of the first type of lines. Each of the first type of lines and the second type of line connect by a second via to a backside metallization level under the first backside metallization level.

Embodiments of the present invention also provide semiconductor structures where each of the second type line is between adjacent first type of lines and is shorter than the plurality of first type of lines. The second type line has a top surface that is one of: above a top surface of the first type of lines, level with the top surface of the first type of lines, in the middle of the first type of lines, or below the top surface of the first type of lines.

Embodiments of the present invention provide a first front side metal level with a plurality of first type of lines and at least one second type line. The plurality of first type of lines with a wider line top surface than a line bottom surface has a first width and a first height. The first type of lines each connect by one of a plurality of first vias to a second front side metal level. The first type of lines each connect by one of a plurality of second vias to one of a semiconductor device or a metal level that is under the first metal level when the first metal level is a M+1 or greater metal level.

The second type line with the wider line top surface than the line bottom surface has a second width that is narrower than the first width. Embodiments of the present invention provide the second type lines with a height that is one of the same height as the first height of the first type of lines or a different height than the first height of the first type of lines. The plurality of first type of lines with a wider line top surface than a line bottom surface has a first width and a first height. Each of the plurality of second type line is between adjacent lines of the plurality of first type of lines and has the same height. The second type line has a top surface that is one of: above a top surface of the first type of lines, level with the top surface of the first type of lines, in the middle of the first type of lines, or below the top surface of the first type of lines.

Embodiments of the present invention provide a plurality of first vias where each first via connects a semiconductor device of a plurality of semiconductor devices to one of a plurality of first type of lines or at least one second type line in a first metal level. The second type line is between two adjacent first type of lines. The second type has a narrower cross-section than each of the first type of lines. Each of the first type of lines and the second type line have a wider line top surface than a line bottom surface. A third-via of a plurality of third vias connects one of a first type of line or a second type line with a line in a second front side metal level.

A plurality of through-silicon vias (TSVs) in a semiconductor substrate each connect one semiconductor device to a via of a plurality of fourth vias in a first backside dielectric layer under the backside of the semiconductor substrate. Each of the fourth vias connect to one of a plurality of backside first type of lines or to one of at least one backside second type line in a first backside metal level. The backside second type line is narrower than each of the backside first type of lines and is between two adjacent backside first type of lines. Each of the backside first type of lines and the backside second type line connect by a fifth via to a second backside metallization level.

Embodiments of the present invention provide at least one backside second type line that is between two adjacent backside first type of lines. The backside second type has a narrower cross-section than each of the backside first type of lines. Each of the backside first type of lines and the backside second type line have a wider line top surface than a line bottom surface. The backside second type line has a top surface that is one of: above a top surface of the backside first type lines, level with the top surface of the backside first type of lines, in the middle of the backside first type of lines, or below the top surface of the backside first type of lines. Embodiments of the present invention provide the backside second type lines that have one of a same height as the backside first type of lines or a different height than the backside first type of lines. Embodiments of the present invention disclose that more than one of the backside second type lines with a different height are present in a backside metal level and that the backside first type of lines and the backside second type of lines are in more than one backside metal level.

BRIEF DESCRIPTION OF THE DRAWINGS

The above and other aspects, features, and advantages of various embodiments of the present invention will be more apparent from the following description taken in conjunction with the accompanying drawings.

FIG. 10 depicts a cross-sectional view of the semiconductor structure after etching a trench for a second type line in accordance with an embodiment of the present invention.

FIG. 11 depicts a cross-sectional view of the semiconductor structure after depositing a metal material in the trench and recessing the metal material in the trench in accordance with an embodiment of the present invention.

FIG. 12 depicts a top view of the semiconductor structure after forming a via over the metal material of the second type line and depositing another layer of metal material over the semiconductor structure in accordance with an embodiment of the present invention.

DETAILED DESCRIPTION

Figure 1A:
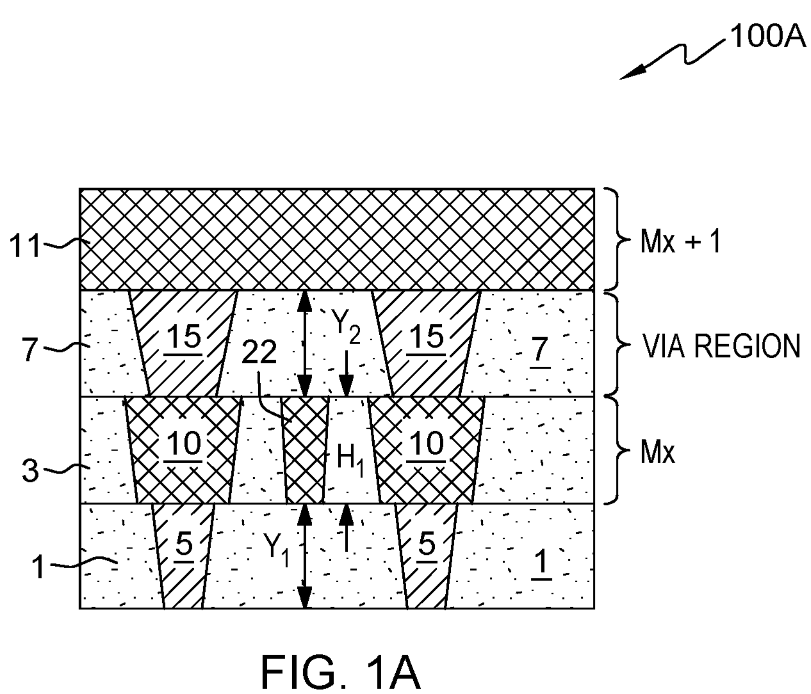
FIG. 1A depicts a cross-sectional view of a semiconductor structure with two first type of lines and a second type line in a backside metallization level in accordance with an embodiment of the present invention.

Embodiments of the present invention recognize that advanced semiconductor device designs are driving more circuits into semiconductor chips. In order to provide more circuits and devices in semiconductor chips, feature sizes such as line widths and space between device elements are shrinking as more device interconnects are needed. As the devices and the interconnect lines become smaller, the devices and interconnect lines in the semiconductor chips become more resistive and can use more power.

Embodiments of the present invention recognize that moving the power delivery network to the backside of the wafer utilizing through silicon vias (TSVs) to connect to front side metal layers reduces wiring demand on front side wiring layers. Using multiple backside metal layers for the backside power delivery network provides more power and ground lines and more power planes than conventional buried power rails to distribute power. Embodiments of the present invention recognize that new semiconductor structures providing an ability to form additional wiring in backside metal layers or front side metal layers would be desirable.

Embodiments of the present invention provide semiconductor structures and methods of forming semiconductor structures that form two types of lines in a metal level. Embodiments of the present invention disclose second type lines with a smaller cross-section than the two first lines directly surrounding the second type lines where the first type lines and second type lines reside, at least in part, in the same metal level. Embodiments of the present invention provide at least one second type line, formed with damascene processes, that is formed between two adjacent lines of the first type lines.

Embodiments of the present invention provide second type lines that have top or bottom surfaces that are level with the top and bottom surfaces of the two adjacent first type lines or are above or below the top or bottom surfaces of the first type lines. Embodiments of the present invention disclose forming two types of lines with at least one second type line where each second type line resides directly between two adjacent first type lines in a single metal level. Embodiments of the present invention disclose the metal level with the first and second type lines is in one of (1) a backside BEOL metal level, (2) in more than one backside BEOL metal level, (3) in a frontside BEOL or middle-of-line metal level, (4) in one or more frontside BEOL metal levels, or (5) in at least one metal level in both a backside BEOL metal level and a frontside BEOL metal level and where, in all examples, both the first type lines and second type line are formed by damascene processes. Using a damascene process to form both the first type lines and the second type lines results in lines with the line surface closest to the semiconductor substrate surface that is smaller than the line surface further away from the semiconductor substrate (e.g., trapezoidal shaped lines).

Embodiments of the present invention provide adjacent first type lines in metal level with a known technology node width and pitch. For example, in a metal level of a semiconductor chip forming FEOL devices with a post 2 nm technology node, the devices can have with a 160 nm cell height, a 40 nm line width, and a 40 nm space (80 nm line pitch). In this example, there is not space to form a 40 nm line between the two 40 nm lines in the metal level. However, embodiments of the present invention disclose forming a smaller or narrower line between two adjacent first type lines in a single backside or frontside metal level. Embodiments of the present invention disclose forming second line with a line width less than the first type lines. In the example above with two first type lines with 40 nm line width and a 40 nm space between them, a second type line with a 20 nm width can be formed between the two first type lines. The second type line with the 20 nm width may have a bottom surface that is 20 nm below the bottom surface of the two first type lines in a backside BEOL wiring layer, for example. In this example, forming a second type line partially below and between the two first type lines can provide additional wiring for signals or power in the backside BEOL wiring.

Embodiments of the present invention disclose forming a portion or all of the second type line in the via region above or partially above two adjacent first type lines. Embodiments of the present invention disclose using the second type line to route signals or additional power lines between two adjacent first type lines in a metal level. An ability to form more signal or ground lines in either the backside or front side BEOL interconnect wiring reduces signal line congestion in the middle-of-line (MOL) or front side BEOL interconnect wiring. The second type lines may be shielded by the first type lines in embodiments where the first type lines are VDD (operating voltage) and/or VSS (ground) to improve signal line and semiconductor chip electrical performance.

Embodiments of the present invention disclose several sizes of the second type lines between the adjacent first type lines in a single metal level. In the same metal level, second type lines with the same height as the first type lines may be present along with second type lines that are smaller and with a lower height than the first type lines. In various embodiments, a second type line may have a top surface below the next metal layer and above the top surface of the first type lines. The top surface of the second type line may be below the bottom surface of the first type lines and a bottom surface above the lower metal level. The second type line may have a bottom surface that is half-way up or is level with the middle portion of the first type lines. In other words, in this example, the second type line has a top surface that is in the middle of the first type lines.

Embodiments of the present invention disclose second type lines in the same metal level as the first type lines where the second type line(s) are (1) level with the first type lines and have the same height, (2) that are partially above the first type lines with the same or a different height than the first type lines, (3) that reside above the first type lines and are shorter than the first type lines, (4) that are partially above the first type lines and have the same or a different height than the first type lines, (5) that are partially below the first type lines and have the same or a different height than the first type lines, or (6) that are below the first type lines and are shorter than the first type lines. In each of these examples of second type lines, one or more of these second type lines and the adjacent first type lines can reside in a metal level that is below or above the semiconductor substrate. Embodiments of the present invention include the first type lines and the second type lines that are below, above, or on both sides of the semiconductor substrate. Embodiments of the present invention form one or more second type lines that are each between two adjacent first type lines in each of several metal levels. Embodiments of the present invention include second type lines that are composed of a different metal than the first type lines and first type lines that can be notched in sidewalls adjacent to the second type lines.

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art, for magnetic tape heads, and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. For the purposes of describing the present invention, the terms "first type of lines" and "first type lines" are interchangeable and relate to a first type of line that is different than a second type line or a second type of line. Similarly, a "backside first type line" and a "backside first type of line" are also interchangeable terms. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention. For the purposes of the present invention, the terms "metallization level" and "metal level" refer to essentially the same elements and can be considered interchangeable.

Figure 3:
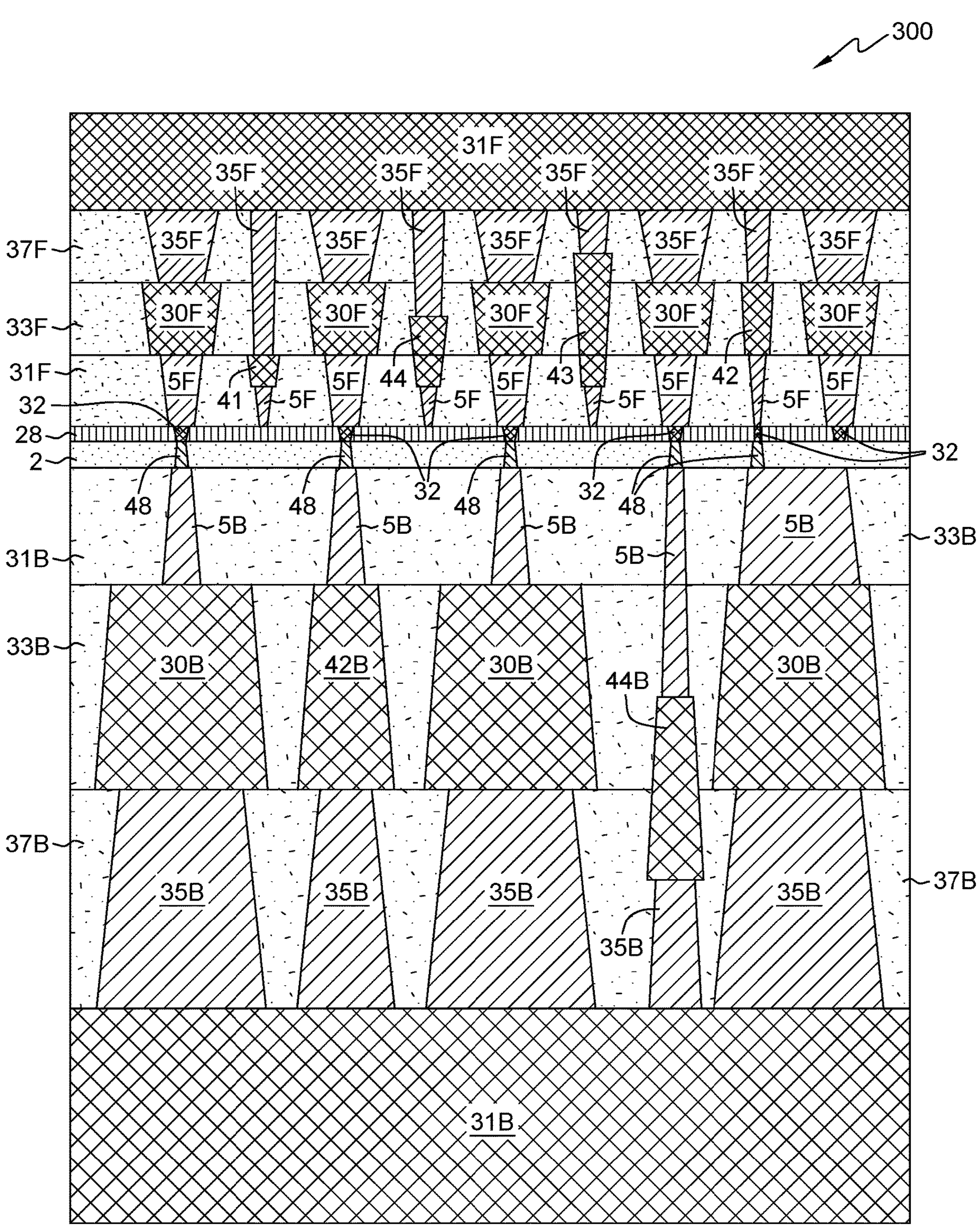
FIG. 3 depicts a cross-sectional view of a semiconductor structure with the first type of lines and the second type lines above the front-end-of-line (FEOL) semiconductor devices and backside of the semiconductor substrate first type of lines with backside second type lines under a semiconductor substrate in accordance with an embodiment of the present invention.

Embodiments of the present invention discussing backside back-end-line (BEOL) metal levels in backside BEOL interconnect wiring may use the terms "under" or "below" for a metallization level or metal layer that is closer to the backside surface of the semiconductor substrate as the semiconductor substrate is commonly flipped during backside BEOL formation. Similarly, when discussing the backside BEOL interconnect wiring, the terms "over" or "above" layer can relate to a layer or a metal level that is further from the backside surface of the flipped semiconductor substrate. In other embodiments, as depicted in FIG. 3, the backside BEOL interconnect wiring is under the backside of the semiconductor substrate and the front side BEOL interconnect wiring is above the semiconductor substrate (not flipped).

As depicted in each of FIGS. 1-13, each of the first type lines and second type lines in the same metal level have a larger line top surface than the line bottom surface where the top surface is the line surface that is furthest from the semiconductor substrate. As depicted in each FIGS. 1-13, each of the first type lines have a width that is greater than the width of each the second type lines formed between two adjacent first type lines. Each of the first type lines, the second type lines, and the line in a metal level above or below the first and second type lines in FIGS. 1-13 can be composed of, but are not limited to copper, ruthenium, cobalt, tungsten, or other metal or metal alloy material suitable for forming lines (e.g., signal lines, power lines, and power rails) in semiconductor chips. Vias formed in FIGS. 1-13, can be composed of any known via metal (e.g., copper, ruthenium, etc.) used in forming semiconductor chips.

FIG. 1A depicts a cross-sectional view of semiconductor structure 100A with first type line 10 and second type line 22 in backside metal level Mx, in accordance with an embodiment of the present invention. As depicted, FIG. 1A includes vias 5, dielectric 1, dielectric 3, first type line 10 in backside metal level Mx, second type line 22, vias 15, and dielectric 7, line 11 in backside metal level Mx+1. A via region for vias 15 is identified. Not depicted in FIG. 1A is vias 5 under second type line 22 (where distance Y1 is illustrated) and via 15 over second type line 22 connecting to line 11 in Mx+1 metal level (where distance Y2 is illustrated but depicted in FIGS. 1B-1D). In some embodiments, vias 5, vias 15, first type lines 10, and second type lines 22 are formed with the same metal such as but not limited to copper. In other embodiments, first type lines 10 and second type line 22 are formed with different metals.

FIG. 1A includes an illustration of the height, H1 of second type line 22, a distance Y1 from the bottom of second type line 22 to the top of substrate 2, and the distance Y2 from the top of second type line 22 to line 11 in backside metal level Mx+1. The magnitude of H1, Y1, and Y2 can vary in other examples. For example, a different second type line such as second line 23 in FIG. 2 has a larger H1 and smaller magnitudes of Y1 and Y2.

For the purposes of the present invention, elements depicted in one Figure can be present in any of the FIGS. 1-13 although not specifically depicted. For example, semiconductor substrate 2 in FIG. 3 may be present under vias 5 and dielectric 51 in FIGS. 1A-1D. In various embodiments, vias 5 in FIG. 1A connect to first type lines and second type lines to semiconductor devices (not depicted in FIG. 1A but depicted as vias 5 in FIG. 3). In other embodiments, vias 5 connect by through-silicon vias (not depicted) to lines in a first backside metal level (depicted as vias 5B connecting the through-silicon vias (TSVs) 48 to first type lines 30B and second type lines 42B and 44B in FIG. 3).

As previously discussed, first type line 10 can have a width and a pitch associated with the process limitations of a current semiconductor chip technology or technology node. For example, if the semiconductor devices have a 160 nm cell height only two 80 nm pitch lines can fit withing the cell. Any additional wiring would have to utilize the "second line type" as disclosed by the present invention. Ideally, as semiconductor devices continue to shrink and performance continues to increase, an ability to route some of the signal wires in the backside BEOL interconnect wiring would be desirable or adding additional second type lines between first type lines in the front side BEOL interconnect wiring. Inserting a thinner line such as second type line 22 between the two adjacent first type lines 10 provides additional wiring.

First type line 10 and second type line type 22 are formed using known damascene processes. In some cases, a liner (not depicted) is present in first type lines 10 and second type line 22. First type lines 10 are wider than second type line 22. The narrower second type line 22 in the Mx metal level is formed between two adjacent first type lines 10 in the Mx level. Second type line 22 is inserted or formed at one half of the line-to-line pitch of first type lines 10.

First type line 10 is depicted in a backside metal level, labeled Mx, above the backside of substrate 2. As known to one skilled in the art, first type line 10 can be in higher backside metal level such as Mx+3 metal level. The higher number metal level further away from the semiconductor substrate has a larger line with a larger line-to-line pitch between adjacent first type lines 10 in the higher metal level. Second type line 22, in this case, can also be formed in the higher backside metal level between two adjacent first type lines 10. Second type line 22 can also be formed between two adjacent first type lines 10 in the fourth backside metal level away from or below the semiconductor substrate.

In some embodiments, the wider portion of first type lines 10 formed with the damascene processes that are adjacent to second type line 22 is notched. In some cases, the sidewall of first type lines 10 adjacent to second type line 22 may be directionally etched to make an upper corner (the widest portion of the trench forming first type lines 10) less wide, for example, using an undercut etch. In other cases, the shape of first type line 10 is not a regular trapezoidal shape but has one of the two sidewalls adjacent to second type line 22 that is steeper (e.g., closer to 90-degree sidewall than the sidewall away from first type line 10). In these embodiments, the two center sidewalls of first type lines 10 that are adjacent to second type line 22 would be more vertical than the two outside sidewalls of first type lines 10 that are away from second type line 22.

Second type line 22 can be composed of the same metal as first type line 10 and line 11 or second type line 22 can be composed of a different metal than first type line 10. For example, first type line 10 and line 11 can be composed of copper and second type line 22 can be composed of ruthenium or cobalt but are not limited to these metal materials.

In various embodiments, dielectric 1, 3, and 7 may be different layers of the same dielectric material. In some embodiments, dielectric 1, 3, and 7 are different dielectric materials or a mix of dielectric materials (e.g., dielectric 5 and 7 are the same dielectric material and dielectric 1 and 3 are a different dielectric material). Dielectric 1, 3, or 7 can be composed of two layers of dielectric material. As depicted, vias 5 may be formed in dielectric 1. First type lines 10 and second type lines 22 may be formed in dielectric 3. One or more of dielectric 1, 3, and 7 may be composed of a low dielectric material with a dielectric constant equal to or less than 3.9, or one or more of dielectric 1, 3, and 7 may be composed of a high k dielectric material. For example, dielectric 1, 3, and 7 can each be one or more layers of hafnium oxide material (e.g., $HfO_2$), a zirconium oxide material (e.g., $ZrO_2$), an aluminum nitride material (e.g., AlN), a silicon oxide (e.g., $SiO_2$) or an aluminum oxide material (e.g., $Al_2O_3$) or a combination of these materials but are not limited to these dielectric materials. In various embodiments, dielectric 1 with vias 5 resides on a semiconductor substrate. In other embodiments, dielectric 1 with vias 5 reside on another metal level (e.g., a M0 metal level with semiconductor devices, a Mx+3 metal level, etc.).

As depicted in FIG. 1A, the height of second type line 22 (H1) is the same as the height of first type line 10. The distance from the top of second type line 22 (Y2) to line 11 is the same as the distance from the top of first type line 10 to line 11. The distance from the bottom of second type line (Y1) to the substrate (not depicted) under dielectric 1 and vias 5 is the same as the distance of the bottom of first type line 10 to the substrate. In other examples, H1, Y1, and Y2 associated with the second type line (e.g., second type lines 23, 20, and 24 depicted in FIG. 2) have different magnitudes. Second type line 22 has top and bottom surfaces that are level with the top and bottom surfaces of first type lines 10.

Figure 1B:
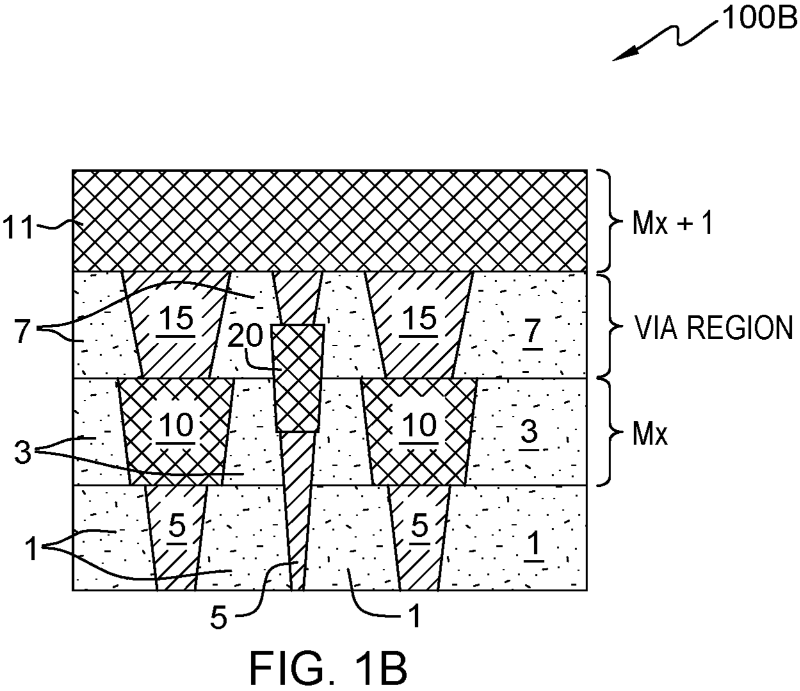
FIG. 1B depicts a cross-sectional view of a semiconductor structure with two first type of lines and a second type line with a bottom surface above a bottom surface of the first type of line in a backside metallization level in accordance with an embodiment of the present invention.

FIG. 1B depicts a cross-sectional view of semiconductor structure 100B with first type lines 10 and second type line 20 with a bottom surface above a bottom surface of first type lines 10 in backside metal level labeled Mx in accordance with an embodiment of the present invention. As depicted, FIG. 1B includes first type lines 10 in backside Mx metal level, second type line 20 in backside Mx metal level, line 11 in the backside Mx+1 metal level, dielectric 1, 3, and 7, vias 15, and vias 5. A via region between the backside Mx metal level and the backside Mx+1 metal level is illustrated in FIG. 1B.

Second type line 20 with a height, H1, that is essentially equal to the height of first type lines 10, has a top surface above the top surface of first type lines 10 and extends into the via region. Second type line 20 has a bottom surface that is above the bottom surface of first type lines 10. As previously discussed, second type line 20 is between two adjacent first type lines 10 and is narrower than first type lines 10. Both second type line 20 and first type lines 10 have a larger line top surface than the line bottom surface.

In various embodiments, second type line 20 and first type lines 10 are a first backside metal level in the backside BEOL interconnect wiring. In other embodiments, second type line 20 and first type lines 10 are in different backside metal level (e.g., the third backside metal level). Second type line 20 can be formed in any backside metal level and may be formed in two or more backside metal levels (e.g., second type lines 20 are formed in the second backside metal level and the fourth backside metal level). In some embodiments, second type line 20 and first type lines 10 are a front side metal level in the front side middle-of-line (MOL) or front side BEOL interconnect wiring.

Figure 1C:
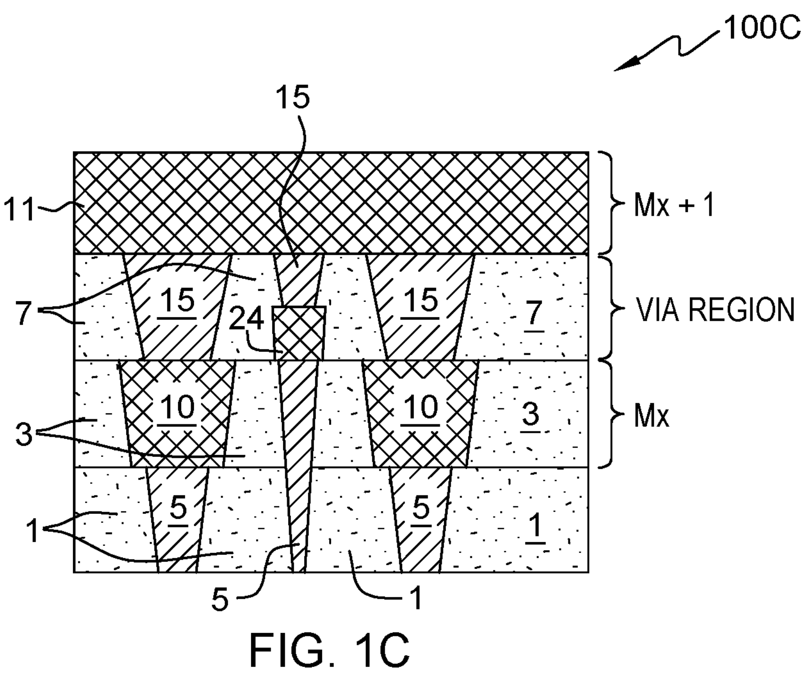
FIG. 1C depicts a cross-sectional view of a semiconductor structure with two first type of lines and a second type line with a bottom surface level with the first type of lines in a backside metallization level in accordance with an embodiment of the present invention.

FIG. 1C depicts a cross-sectional view of semiconductor structure 100C with first type lines 10 and second type line 24. Second type line 24 has a bottom surface above a bottom surface of first type lines 10. As depicted, FIG. 1C includes first type lines 10 in backside Mx metal level, second type line 24 in backside Mx metal level, line 11 in the backside Mx+1 metal level, dielectric 1, 3, and 7, vias 15, and vias 5. A via region between the backside Mx metal level and the backside Mx+1 metal level is identified in FIG. 1C.

Second type line 24 with a height, H1, has a lower height or has a shorter height than the height of first type lines 10. Second type line 24 has a top surface above the top surface of first type lines 10 and extends into the via region. Second type line 24 has a bottom surface that is level with the top surface of first type lines 10. As previously discussed, second type line 24 is between two adjacent first type lines 10 and is narrower than first type lines 10. Both second type line 24 and first type lines 10 have a larger line top surface than the line bottom surface. In some cases, vias 5 connect first type lines 10 and second type line 24 with TSVs (not depicted in FIG. 1C). The TSVs may connect vias 5 to semiconductor devices (not depicted) in the front-end-of-line (FEOL) device layer.

Similar to first type lines 10 and second type line 20 depicted in FIG. 1B, first type lines 10 and second type line 24 may reside in one or more metal layers of the backside BEOL interconnect wiring, the front side MOL, or front side BEOL interconnect wiring. As depicted in FIG. 1C, both first type lines 10 and second type line 24 are formed in a single metal level, where second type line 24 resides in the via region between Mx metal level and Mx+1 metal level. Second type line 24 and first type lines 10 residing in the same metal level, may both reside together in more than one metal level (e.g., first type lines 10 and second type line 24 are formed in the Mx metal level and Mx+3 backside metal level). Second type line 24 between two adjacent first type lines 10 can be formed in any backside metal level and may be formed in two or more backside metal levels. Second type line 24 between two adjacent first type lines 10 can be formed in any front side metal level above the semiconductor devices and may be formed in two or more front side metal levels (above the M0 metal level).

Figure 1D:
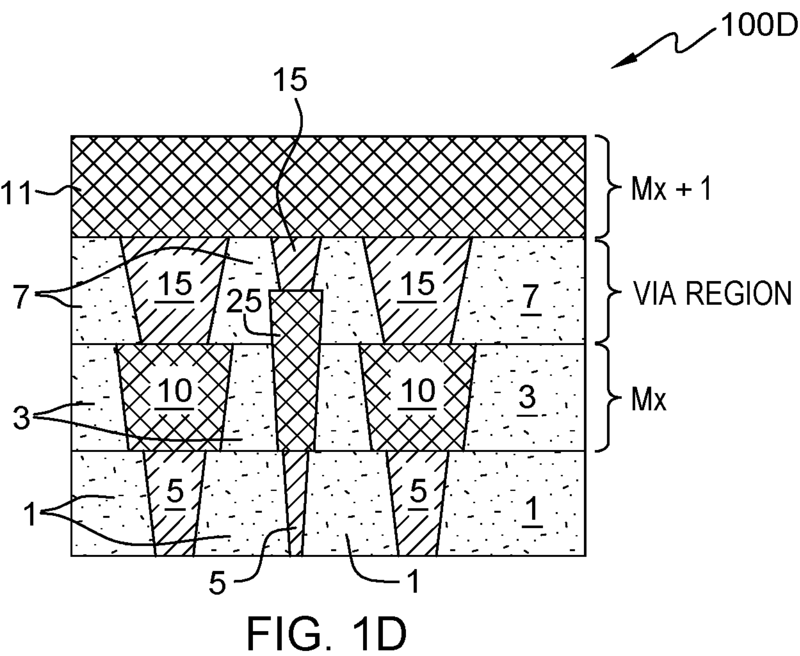
FIG. 1D depicts a cross-sectional view of a semiconductor structure with two first type of lines and a second type line with the top surface above the top surface of the first type of line in a backside metallization level in accordance with an embodiment of the present invention.

FIG. 1D depicts a cross-sectional view of semiconductor structure 100D with first type lines 10 and second type line 25 with a bottom surface level with the bottom surface of first type lines 10 in accordance with an embodiment of the present invention. As depicted, FIG. 1D includes first type lines 10 in backside Mx metal level, second type line 25 in backside Mx metal level, line 11 in the backside Mx+1 metal level, dielectric 1, 3, and 7, vias 15, and vias 5. A via region is illustrated in FIG. 1D between the Mx metal level and the Mx+1 metal level. As depicted, vias 15 connect first type lines 10 and second type line 25 to line 11 in Mx+1 metal level above first type lines 10 and second type line 25.

Second type line 25 with a height, H1, has a larger height than the height of first type lines 10. Second type line 25 has a top surface above the top surface of first type lines 10 and extends into the via region. Second type line 25 has a bottom surface that is level with the bottom surface of first type lines 10. As previously discussed, second type line 25 is between two adjacent first type lines 10 and is narrower than first type lines 10. Both second type line 25 and first type lines 10 have a larger line top surface than the line bottom surface.

As previously discussed with regard to first type lines 10 and second type line 20 in FIG. 1B, second type line 25 and first type lines 10 can reside in one or more metal layers of the backside BEOL interconnect wiring, the front side MOL, or the front side BEOL interconnect wiring. In various embodiments, second type line 25 and first type lines 10 both reside in the same metal level, may both reside together in more than one metal level (e.g., first type lines 10 and second type lines 24 are formed in the Mx metal level and Mx+3 backside metal level). Second type line 25 between two adjacent first type lines 10 can be formed in any backside metal level and may be formed in two or more backside metal levels. Second type line 25 between two adjacent first type lines 10 with vias below and above first type lines 10 and second type line 25 can be formed in any front side metal level above the semiconductor devices and may be formed in two or more front side metal levels (e.g., Mx+3 metal level and Mx+5 metal level).

Figure 2:
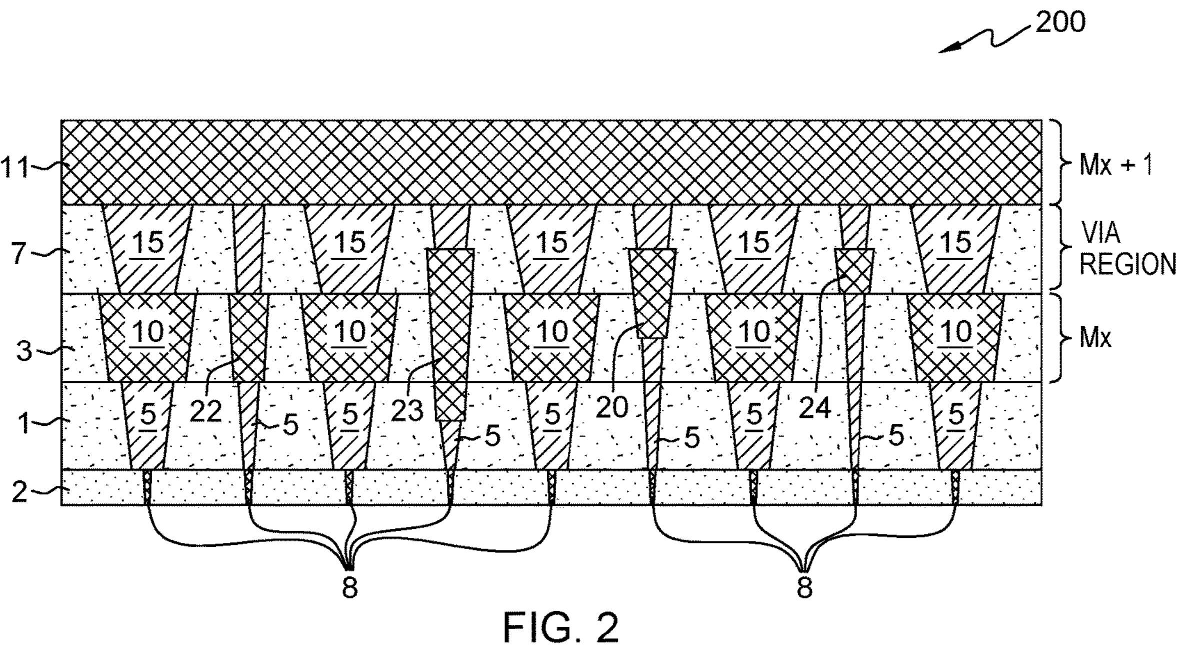
FIG. 2 depicts a cross-sectional view of a semiconductor structure with the first type of lines and a plurality of the second type line in a backside side metallization level in accordance with an embodiment of the present invention.

FIG. 2 depicts a cross-sectional view of semiconductor structure 200 with first type line 10 and second type lines 22, 23, 20, and 24 in a front side metallization level Mx, in accordance with an embodiment of the present invention. As depicted, FIG. 2 includes vias 5, TSVs 8 in substrate 2, first line type 10, second line type 22, 23, 20, and 24, vias 15, line 11, dielectric 1, 3, and 7. Most of the elements in FIG. 2 are essentially the same as the elements discussed with respect to FIG. 1A-D except for TSVs 8 and substrate 2.

FIG. 2 depicts second line type 22, 23, 20, and 24 in a single front side metal level (e.g., front side Mx metal level) where dielectric 1 and vias 5 may reside on either another front side metal level (e.g., Mx-1 metal level) or on a semiconductor device (not depicted in FIG. 2) above TSVs 8 in substrate 2 and a portion of substrate 2. In some embodiments, one or more of second line type 22, 23, 20, and 24 are present in the backside Mx metal level. For example, second type line 22 and second type line 20 depicted in FIG. 2 on the front side of substrate 2 may also be formed with similar shapes and may be a different size on a backside Mx metal level between adjacent first type lines 10. In other examples, second type line 20 and 24 are each residing between two adjacent first type lines 10 in a third backside metal level and second type line 25 resides between two adjacent first type lines 10 in a fifth backside metal level.

Substrate 2 can be any semiconductor substrate material used in semiconductor chips. For example, substrate 2 can be silicon or SiGe but is not limited to these semiconductor materials. In some embodiments, substrate 2 is a thinned semiconductor substrate. Typically, a semiconductor wafer undergoes a backside wafer grind for wafer thinning prior to forming the backside BEOL interconnect wiring depicted in FIG. 3. In various embodiments, substrate 2 includes TSVs 8 which may be nano TSVs. TSVs 8 can connect the semiconductor devices (not depicted in FIG. 2) formed on semiconductor substrate 2 with the backside BEOL interconnect wiring (not depicted in FIG. 2). As depicted, vias 5 connect each first type line 10 and second type line 22 with the semiconductor devices (not depicted) formed on the front side of the semiconductor substrate.

As depicted in FIG. 2, each of second type lines 22, 23, 20, and 24 may illustrate a different second type line location and height, H1, creating different magnitudes for distances Y1 and Y2. A second type line is not limited to these heights, H1, depicted and these distances depicted for Y1 and Y2. In various embodiments, one of second type lines 22, 23, 20, and 24 are present in a single metallization level between adjacent first type lines 10.

As depicted in FIG. 2, second type line 20 has a top surface above the top surface of first type lines 10 but below line 11 and a bottom surface that is approximately in the middle portion of first type lines 10. The height, H1, of second type line 20 the same as the height, H1, of first type lines 10. Second type line 23 has a top surface above the top surface of first line type 10 and a bottom surface that is below the bottom surface of first line type 10 in FIG. 2.

Second type line 23 has a height, H1, that is greater than the height of first type lines 10. Second type line 23 has a Y1 and a Y2 that is less than Y1 and Y2 of first type lines 10 in FIG. 1A. Second type line 24 has a top surface above the top surface of first type lines 10 but under line 11 and a bottom surface that is level with the top surface of first type lines 10. Second type line 24 has a height, H1, that is less than the height, H1, of first type lines 10 (e.g., second type line 24 is approximately one half the height of first type lines 10).

While FIG. 2 depicts first type lines 10 and second type lines 20, 22, 23, and 24 in a first front side metal level above substrate 2, in other embodiments, first type lines 10 and one or more of second type lines 20, 22, 23, and 24 may be another front side metal level or in more than one front side metal level (e.g., first type lines 10 and second type line 20 may be in the Mx+2 metal level while first type lines 10 and second type lines 22 and 24 are in the Mx+4 metal level connected by vias). In some embodiments, one or more of second type lines 20, 22, 23, and 24 are present in a single metal level. As previously discussed, second type lines 20, 22, 23, and 24 may be present in one or more backside BEOL interconnect metal layers or levels in other examples.

FIG. 3 depicts a cross-sectional view of semiconductor structure 300 with frontside first type lines 30F, frontside second type lines 41, 44, 43, and 42, backside first type lines 30B, and backside second type lines 42B and 44B in accordance with an embodiment of the present invention. As depicted, FIG. 3 includes backside first type lines 30B, front side first type lines 30F, backside second type lines 42B and 44B, frontside second type lines 41, 44, 43, and 42, vias 35B, vias 35F, vias 5B, vias 5F. TSVs 48 in substrate 2, front-end-of-line (FEOL) device region 28, semiconductor devices 32, line 31B, line 31F, dielectric 37B, 37F, 33B, 33F. 31B, and 31F. Semiconductor devices 32 may be formed in the M0 metal level of FEOL device region 28. In some cases, not all of semiconductor devices 32 are depicted in FEOL device region 28. The surface of each of first type lines 30B and 30F and second type lines 42B, 44B, 41, 44, 43, and 42 closest to substrate 2 have a smaller surface than the line surface that is further away from substrate due to damascene formation processes.

As depicted, FIG. 3 illustrates two types of lines including (1) first type lines 30B and second type lines 42B and 44B formed in a first backside metal level below the backside of substrate 2 and two types of lines including (2) first type lines 30F and second type lines 41, 44, 43, and 42 formed in a first metal level above semiconductor devices 32 in FEOL device region 28 on the frontside of substrate 2. Second type lines 42B and 44B are between adjacent first type lines 30B. Second type lines 42B and 44B have a smaller width than first type lines 30B. Second type line 44B is below a top portion and bottom portion of first type lines 30B. As previously discussed, the ability to insert smaller width lines in the space between conventionally spaced first type lines such as first type lines 30B allows some wiring on the backside of substrate 2 to be used for purposes other than power delivery. For example, second type lines 42B and 44B can be used for signal routing, clocking, or input/output (I/O). Forming second type lines 42B and 44B between first type lines 30B can relieve MOL and BEOL wiring congestion in the frontside of semiconductor chip formed with semiconductor structure 300. Similarly, creating front side second type lines 41, 44, 43, and 42 that are each between adjacent first type lines 30F can provide additional wiring in the front side of the semiconductor chip. In various embodiments, only one size of second type line is formed between two adjacent first type lines 30F. For example, only second type line 44 is formed between two adjacent first type lines 30F. In other examples, two or more of second type lines 41, 42, 43, and 44 are present between first type lines 30B.

In FIG. 3, vias 35B connect first type lines 30B and second type lines 42B and 44B to line 31B in a backside metallization level (e.g., Mx backside metal level). Vias 5B connect first type lines 30B and second type lines 42B and 44B to TSV 48 in substrate 2. TSV 48 connects backside vias 5B to semiconductor devices 32 in FEOL device region 28. Vias 35B connect first type lines 30B and second type lines 42B and 44B to line 31B in a second backside metallization level (e.g., Mx+1 backside metal level).

As depicted, each of first type line 30F connects by one of via 5F to one of semiconductor device 32 in FEOL device region 28. Vias 5F connect each of second type line 41, 44, 43, and 42 to one of semiconductor devices 32 in FEOL device region 28 (not all of semiconductor devices 32 under vias 5F are depicted in FIG. 3). As depicted in FIG. 3, second type line 41, 44, 43, and 42 are each between two first type lines 30F and have a smaller diameter or width than first type lines 30F. Second type lines 41, 43, 44, and 42 connect by vias 35F to line 31F.

Line 31F is in the frontside metal level above the frontside metal level containing first type lines 30F and second type lines 41, 44, 43, and 42. Line 31F can be in a metallization level (e.g., M2 level) above the metallization level of first type lines 30B and second type lines 41, 43, 44, and 42 (e.g., M1 level). As discussed above, in other examples, first type lines 30B and second type lines 41, 43, 44, and 42 may be formed in another higher metallization level (e.g., the fourth metal level) connecting the metallization level directly above the higher metallization level.

As depicted in FIG. 3, second type line 41 has a height that is less than the height of first type lines 30F with a top surface of second type line 41 that is level with the bottom surface of first type lines 30F. The bottom surface of second type line 41 is below the bottom surface of first type lines 30F. Second type line 44 has a bottom surface below the bottom surface of first type lines 30F and a top surface in the middle of first type lines 30F. Second type line 44 is about the same height as the height of first type lines 30F. Second type line 43 has a top surface above first type lines 30F and a bottom surface below first type lines 30F. Second type line 42 has top and bottom surfaces that are level with the top and bottom surfaces of first type lines 30F.

First type lines 30B and 30F and second type lines 42B, 44B, 41, 43, 44, and 42 may be formed in other metal levels further away from substrate 2. In some embodiments, the first type lines and the second type lines are formed in more than one metal level. For example, first type lines 30B and second type lines 42B and 44B are all formed in two metallization levels (e.g., the second backside metal level and the fourth backside metal level). In one case, at least one of the second type lines are also formed in these two metallization levels (e.g., one of second type line 42B is in the second backside metal level and one of second type line 42B and 44B are in the fourth backside metal level). In another example, first type lines 30F and second type line 44 are formed in the first frontside metal level as depicted and first type lines 30B and second type lines 44B are formed in the third backside metal level and the fifth backside metal level.

As known to one skilled in the art, typically the width and spacing between metal features such as first type lines 30B formed in the backside BEOL interconnect wiring are larger than the width and spacing between metal features such as first type lines 30F formed in the frontside BEOL interconnect wiring.

Dielectric 31B, 33B, 37B, 31F. 33F. 37F, and 37B are similar or essentially the same dielectric materials deposited with similar deposition methods as discussed with respect to FIG. 1A. The thickness and in some cases, the composition of dielectric 31B, 31F. 33B, 33F, 37B, and 37F, as known to one skilled in the art, can be different. The thickness of the dielectric material layers deposited on the backside of substrate 2 can be thicker than similar layers of the dielectric materials and metal layers deposited on the frontside of substrate 2.

Figures 4, 5, 6, 7, 8, 9:
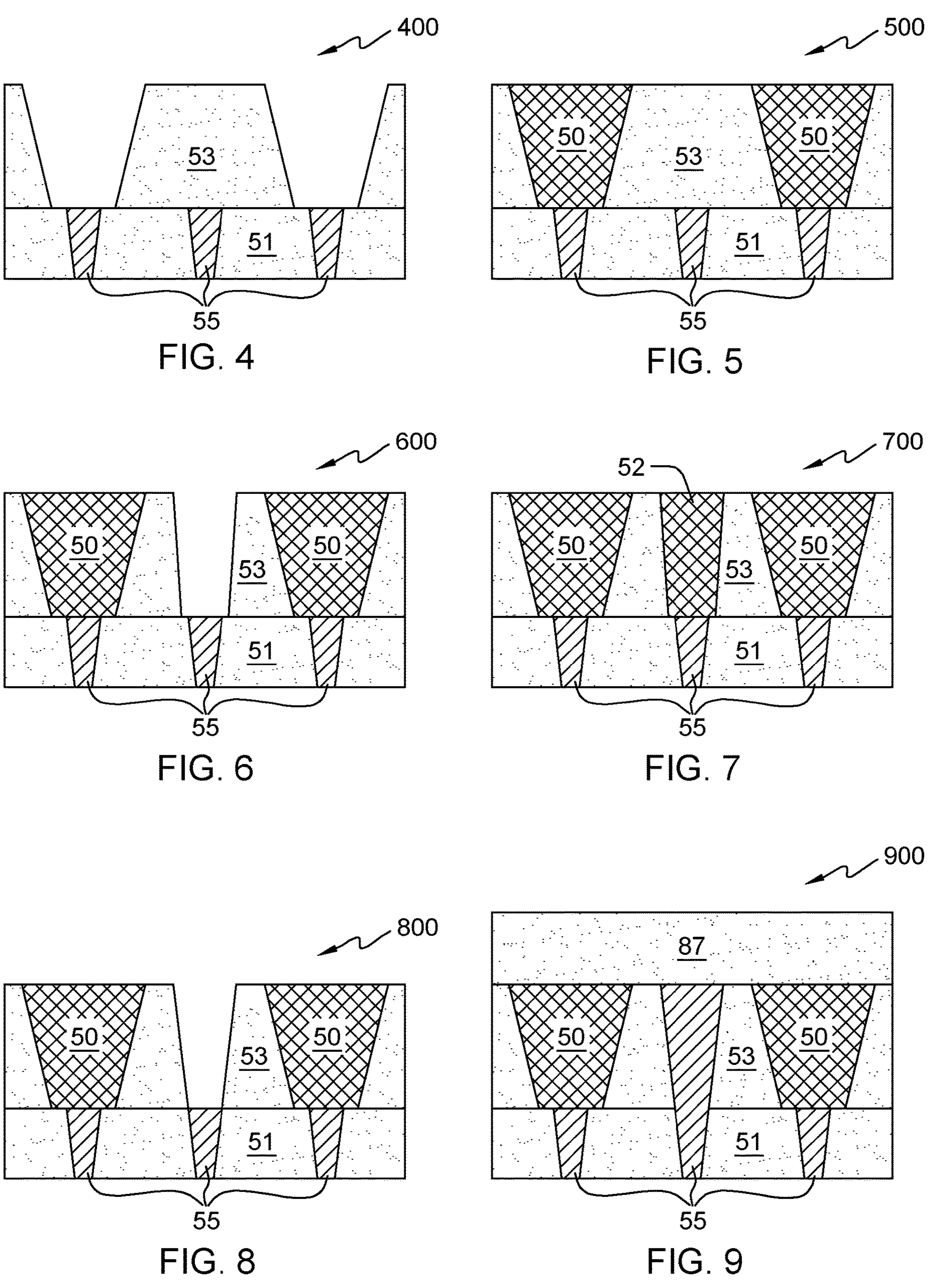
FIG. 4 depicts a cross-sectional view of a semiconductor structure after patterning a first dielectric material to form two trenches in the first layer of a dielectric material for the first type of line in accordance with an embodiment of the present invention.
FIG. 5 depicts a cross-sectional view of the semiconductor structure after depositing a metal layer over the first layer of the dielectric material in accordance with an embodiment of the present invention.
FIG. 6 depicts a cross-sectional view of the semiconductor structure after etching a third trench for a second line in the first layer of the dielectric material in accordance with an embodiment of the present invention.
FIG. 7 depicts a cross-sectional view of the semiconductor structure after depositing a second metal material in the third trench and performing a chemical mechanical polish (CMP) to form the second type line in accordance with an embodiment of the present invention.
FIG. 8 depicts a cross-sectional view of the semiconductor structure after forming a via hole in semiconductor structure 400 in accordance with an embodiment of the present invention.
FIG. 9 depicts a cross-sectional view of the semiconductor structure after depositing metal for a via, performing a CMP, and depositing a dielectric material in accordance with an embodiment of the present invention.

FIG. 4 depicts a cross-sectional view of semiconductor structure 400 after patterning dielectric 53 to form two trenches in dielectric 53 in accordance with an embodiment of the present invention. FIG. 4 illustrates an initial step in a damascene process to form two first type lines in dielectric 51.

As depicted, FIG. 4 includes dielectric 51, vias 55, and dielectric 53. Vias 55 were formed in dielectric 51, previously, using known semiconductor processes for via formation. Dielectric 51 can be above one of (1) the backside of a semiconductor substrate, (2) a backside metal level, (3) a frontside device region (e.g., a M0 metal level), or (4) another upper frontside metal level (e.g., Mx+2 metal level) above the frontside device region.

Dielectric 53 material can be any suitable dielectric material (e.g., $SiO_2$ or $HfO_2$) deposited on dielectric 51 and vias 55 where dielectric 51 can be on the backside of a semiconductor substrate, on a backside metal layer in the backside BEOL interconnect wiring, on semiconductor devices, or a front side BEOL interconnect wiring layer. For example, dielectric 53 is deposited by chemical vapor deposition (CVD), physical vapor deposition (PVD), or atomic layer deposition (ALD) over the third metallization level on the backside of the semiconductor substrate.

Using known semiconductor lithography processes, the top surface of dielectric 53 material is patterned and etched, for example, using a dry etching process such as reactive ion etch (RIE) or a wet etch process. The two trenches formed in dielectric 53 have a narrower bottom surface than the top opening. The dimensions of the two trenches (e.g., height and width) vary according to backside BEOL interconnect wiring layer, the MOL or BEOL interconnect layer, the side of the semiconductor substrate, and the technology node of the semiconductor device processes used. Each of the two trenches are formed on one of vias 55. The two trenches are over the leftmost and rightmost vias 55 in FIG. 4. The two trenches have a width and spacing consistent with a technology node (e.g., 20 nm technology node).

FIG. 5 depicts a cross-sectional view of semiconductor structure 500 after depositing metal layer 50 over dielectric 53 and performing CMP in accordance with an embodiment of the present invention. FIG. 5 illustrates another step in the process to form first type lines 50 in dielectric 53. As depicted, FIG. 5 includes the elements of FIG. 4 and metal layer 50.

Metal layer 50 can be deposited with any suitable semiconductor deposition process (e.g., CVD, PVD, or ALD). Metal layer 50 is composed of a metal material used in semiconductor metal features such as metal lines, power rails, or other power delivery and distribution features. Metal layer 50 can be one of copper, ruthenium, cobalt, or tungsten but is not limited to these metals. After the deposition and CMP, metal layer 50 can form a first type metal line. Hereinafter, metal layer 50 is called first type lines 50.

First type lines 50 have a conventional width, height, and pitch (e.g., space between centerlines of the two first type 1 lines 50) typical for a BEOL metal level used in a technology node such as a 20 nm technology node.

FIG. 6 depicts a cross-sectional view of semiconductor structure 600 after etching a third trench in dielectric 53 between the two first type lines 50 in accordance with an embodiment of the present invention. Using known lithography and etching processes in a second damascene process, a third smaller trench is etched between the two first type line 50 directly on the center via 55. The third trench with a narrower or smaller diameter than first type lines 50. The third trench is formed at ½ the pitch of the technology node or processing used to form first type lines 50.

As depicted in semiconductor structure 600, the depth of the third trench is the same as the depth of the first two trenches and has the same depth as the height of the two first type lines 50. In other examples, the depth of the third trench is different than the height of the two first type lines 50 (e.g., the third trench is not as deep as the first two trenches forming the first type line). The bottom of the third trench is narrower than the top opening of the third trench.

FIG. 7 depicts a cross-sectional view of semiconductor structure 700 after depositing metal material 52 in the third trench and performing CMP to form the second type line in accordance with an embodiment of the present invention. As depicted, FIG. 7 includes the elements of FIG. 6 but with metal material 52 in the third trench. Hereinafter, the third trench filled with metal material 52 will be called second type line 52.

As depicted in FIG. 7, after performing the CMP, the top surface of second type line 52 is halfway between the top surfaces of the two first type lines 50. In various embodiments, the metal material forming second type line 52 is a different metal material than the metal of first type lines 50. For example, metal material 52 can be ruthenium or cobalt. In another embodiment, the metal material forming first type lines 50 and second type line 52 are the same.

In semiconductor structure 700, the first type lines 50 and second type line 52 have the same height. In other examples, the height of first type lines 50 and second type line 52 in the same metallization level is different. As depicted in FIG. 7, the diameter or width of second type line 52 is less than or smaller than the width of first type lines 50. Forming second type line 52 with a smaller diameter or width than the two first type lines 50 provide additional signal wiring for the semiconductor chip. As previously discussed, second type line 52 can be formed into the same metal level containing first type lines 50 in either the backside BEOL interconnect wiring or the frontside MOL or BEOL interconnect wiring.

While FIG. 7 depicts, two first type lines 50 and one second type line 52, in other examples, any number of first type lines 50 and second type lines 52 are formed. As previously discussed, while FIG. 7 depicts one size of the second type lines however in other examples, two sizes of the second type line can be formed. In other examples, second type line 52 can have a different size and can be formed with any of the size second type line depicted in FIG. 2 or FIG. 3.

FIG. 8 depicts a cross-sectional view of semiconductor structure 800 after forming a via hole in dielectric 53 of semiconductor structure 500 in accordance with an embodiment. FIG. 8 depicts a first step in forming a different second type line with a different location than second type line 52 formed in FIG. 7. Semiconductor structure 800 depicts forming a via hole in dielectric 53 of semiconductor structure 500. Starting with semiconductor structure 500, FIG. 8 depicts semiconductor structure 800 after etching a via hole between first type lines 50 on a middle via 55. As depicted, FIG. 8 includes dielectric 51, dielectric 53, vias 55 and first type lines 50.

FIG. 9 depicts a cross-sectional view of semiconductor structure 900 after depositing a metal via material in the via hole etched between the two first type lines 50, performing a CMP, and depositing a layer of dielectric 87 in accordance with an embodiment of the present invention. As depicted, FIG. 9 includes dielectric 51, dielectric 53, first type lines 50, vias 55 where the center via 55 extends into deposited dielectric 87.

Using known semiconductor deposition processes (e.g., CVD, PVD, or ALD), a metal material such as but not limited to copper can be deposited in the via hole. A CMP removes excess via metal over dielectric 57 and first type lines 50. Dielectric 87 that is the same or a different dielectric material as dielectric 51 or 53 can be deposited over semiconductor structure 900.

FIG. 10 depicts a cross-sectional view of semiconductor structure 1000 after etching a trench for a second type line in accordance with an embodiment of the present invention. Using a reactive ion etch or a wet etching process, a trench is etched in dielectric 87 and a top portion of dielectric 53 between a portion of the two first type lines 50. As depicted in FIG. 10, the trench extends from the top surface of dielectric 87 into the top portion of dielectric 53. The bottom of the trench is in a center portion of the two first type lines 50 or extends to about the middle of the two first type lines 50. As depicted in FIG. 10, the top portion of the center via 55 can be removed by the trench etching process. In other words, the trench extends into center area between the top half of the two first type lines 50. In other examples, the trench may be etched deeper or shallower.

FIG. 11 depicts a cross-sectional view of semiconductor structure 1100 after depositing metal material 84 in the trench and recessing metal material 84 in accordance with an embodiment of the present invention. For example, after depositing metal material 84 and performing a CMP, then, using a wet etching process, a top portion of metal material 84 is removed. As depicted in FIG. 11, after etching, the top surface of the remaining portion of metal material 84 is below the top surface of dielectric 87 and above the top surface of first type metal lines 50. In another embodiment, metal material 84 is recessed to the level of the top surface of first type lines 50. In other words, the depth of the recessing of metal material 84 is variable. Recessed metal material 84 forms a second type line that is between the two first type lines 50. Hereinafter, metal material 84 filling the trench formed in FIG. 10 will be called second type line 84.

FIG. 12 depicts a top view of semiconductor structure 1200 after forming via 85 over second type line 84 and depositing another layer of metal material 91 in accordance with an embodiment of the present invention. As depicted, FIG. 12 includes metal material 91 forming a line over vias 85 and dielectric 87, three of vias 55 connecting first type lines 50 and second type line 84 to a lower metal level. As previously discussed, vias 55 may connect first type lines 50 and second type line 84 to one of (1) a backside metal layer in the backside BEOL interconnect wiring. (2) a TSV in a thinned semiconductor substrate, (3) a front side metal layer or metal level in the BEOL interconnect wiring, or (4) a semiconductor device in the FEOL. And, as previously discussed, second type line 84 between first type lines 50 can be formed in one or more metal levels or layers. Additionally, second type line 52 and second type line 84 between two first type lines 50 can be formed in the same metal level. Second type line 84 can be formed with the same or a different metal material than first type lines 50. As depicted in FIG. 12, first type lines 50 are wider than second type line 84.

The process steps discussed with respect to FIGS. 8-12 includes the steps of at least (1) forming a via hole between first type lines 50 in dielectric 53; (2) depositing a via metal, performing a CMP, and depositing a dielectric material over the exposed surfaces of the via, first type lines 50, and dielectric 53; (3) etching a trench in dielectric 87 and in the top portion of dielectric 53 between the top portion of first type lines 50; (4) depositing a metal in the trench and recessing the metal material; (5) forming a via over the recessed metal material and depositing a third layer of dielectric material over the second layer of dielectric material.

The process steps depicted and discussed with respect to FIGS. 8-12 and FIGS. 4-7 can be performed in a dielectric material in either a backside BEOL interconnect wiring layer on the backside of the semiconductor substrate or in a front side MOL or BEOL interconnect wiring layer above the FEOL semiconductor devices in the FEOL device layer. As known to one skilled in the art, the process steps discussed with respect to FIGS. 8-12 or FIGS. 4-7 can be performed in any metal level or in multiple metal levels on the same semiconductor substrate.

Figure 13:
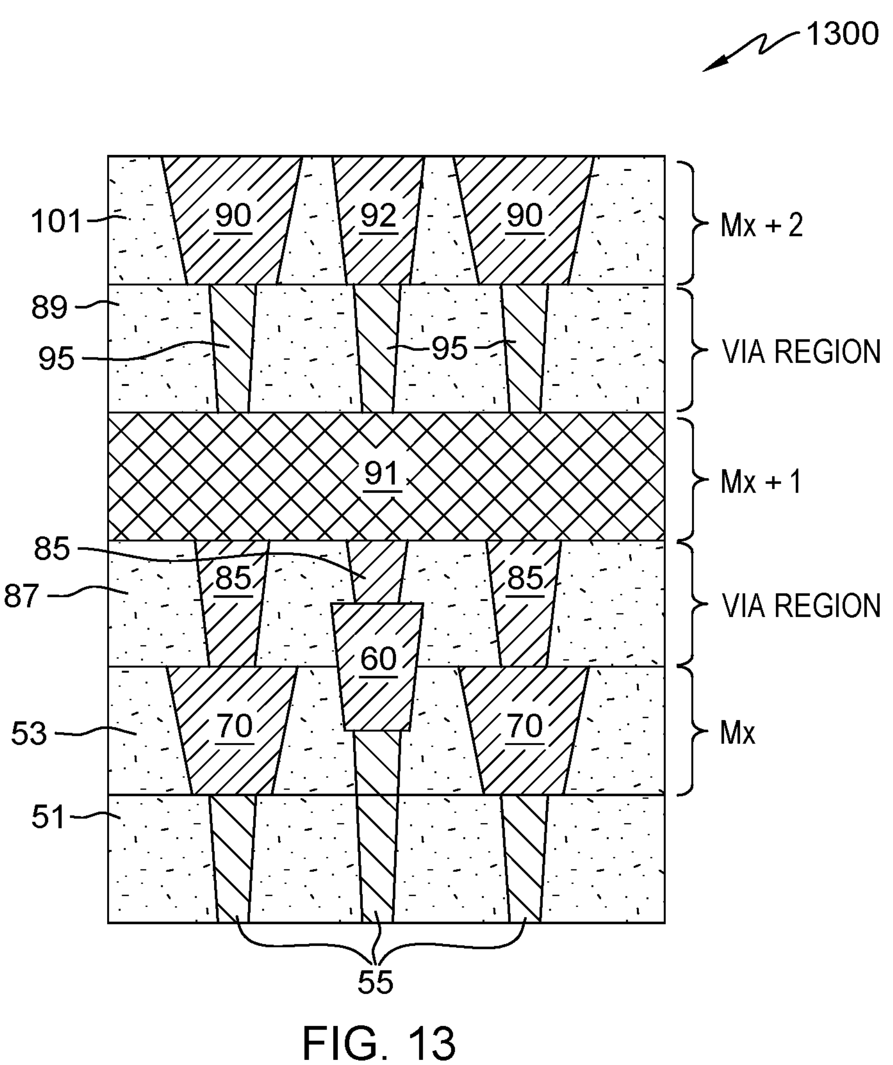
FIG. 13 depicts a cross-sectional view of a semiconductor structure with the first type of line and a second type of line each formed in two different metal levels in accordance with an embodiment of the present invention.

FIG. 13 depicts a cross-sectional view of a semiconductor structure with first type lines 50 and second type line 84 in a Mx metal level and first type lines 90 and second type line 92 in a Mx+2 metal level in accordance with an embodiment of the present invention. As depicted, FIG. 13 includes vias 55, first type lines 50, second type line 84, vias 85, contacting line 91 in the Mx+1 metal level, dielectric 51, 53, 87, 89, and 101, vias 95, first type lines 90 and second type line 92.

FIG. 13 depicts forming second type lines in two metal levels (e.g., Mx metal level and Mx+2 metal level). As illustrated, FIG. 13 depicts semiconductor structure 1300 with vias 95 and first type lines 90 and second type line 92 formed on semiconductor structure 1200. Using the processes discussed with respect to FIGS. 4-7 and in FIGS. 8-12, second type line 92 and first type lines 90 are formed above semiconductor structure 1200 in dielectric 101. Second type line 92 and first type lines 90 can connect by vias 95 to line 91 in a Mx+2 metal level. Second type line 92 and first type lines 90 may be connected by vias to a next metal level not depicted (e.g., Mx+3 metal level). Second type lines, such as second type line 52 and 84 formed between two adjacent first type lines 50 and 90, respectively, may be formed in more than two metal levels and with any of other the second type lines depicted in FIGS. 1-3. Second type lines 24 or 42B may be formed with or instead of second type lines 52 and 84. Mx metal, Mx+1 metal level, and Mx+2 metal level may be formed (1) on a backside of a semiconductor substrate, (2) in a frontside BEOL interconnect wiring layer or metal level, (3) in a front side MOL layer, or (4) in at least two of: a frontside BEOL interconnect wiring layer, a MOL layer, and a front side BEOL interconnect wiring layer.

While the invention has been shown and described with reference to certain exemplary embodiments thereof, it will be understood by those skilled in the art that various changes in form and details may be made therein without departing from the spirit and scope of the present invention as defined by the appended claims and their equivalents. The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor structure comprising:
a plurality of first type of lines in a first metal level with a first line width and a first height, wherein each line of the plurality of first type of lines has a top surface wider than a bottom surface; and
a second type of line in the first metal level with a second line width that is narrower than the first line width in the first metal level, wherein:
a single line of the second type of line is an only line separating adjacent first type of lines;
the second type line has a top surface wider than a bottom surface; and
the top surface of the second type of line is on a plane offset from each of the top surfaces of the plurality of first type of lines.

2. The semiconductor structure of claim 1, further comprising:
a plurality of first vias, wherein each of the plurality of first vias connects a line selected from the group consisting of: (i) the plurality of first type of lines and (ii) the second type line, to a second backside metal level, wherein the first metal level is a first backside metal level.

3. The semiconductor structure of claim 2, wherein each of the plurality of first type of lines and the second type of line connect by a via of a plurality of second vias to a through-silicon via of a plurality of through-silicon vias.

4. The semiconductor structure of claim 2, further comprising:
a third backside metal level includes a plurality of second backside first type of lines and second backside second type of line, wherein the second backside second type of line is between two adjacent lines of the plurality of second backside first type of lines; and
a plurality of third vias connecting: (i) the plurality of second backside first type of lines and (ii) the second backside second type of line, to the second backside metal level.

5. The semiconductor structure of claim 2, wherein:
the top surface of the second type of line is above the top surface of the plurality of first type lines; and
the second type of line has a same height as the first height of the plurality of first type of lines.

6. The semiconductor structure of claim 2, wherein:
the top surface of the second type of line is level with a bottom surface of the plurality of first type of lines; and
the second type of line is composed of a different metal material than the plurality of first type of lines.

7. The semiconductor structure of claim 2, wherein:
the top surface of the second type of line is level with a bottom surface of the plurality of first type of lines; and
the second type of line has a height that is less than the first height.

8. The semiconductor structure of claim 2, wherein the top surface of the second type of line is below a top surface of the plurality of first type of lines and above a bottom surface of the plurality of first type of lines.

9. The semiconductor structure of claim 2, wherein:
the first backside metal level includes more than one second type of line; and
each of the more than one second type of line has a different height.

10. The semiconductor structure of claim 2, wherein each of the plurality of first type of lines and the second type of line connect by a via of a plurality of second vias to a metal level that is closer to a backside of a semiconductor substrate than the first backside metal level.

11. A semiconductor structure comprising:
a plurality of first type of lines with a first line width in a first backside metal level, wherein each of the plurality of first type of lines have a top surface wider than a bottom surface; and
a second type of line in the first backside metal level with a second line width that is less than the first line width, wherein:
each of the second type of line is between adjacent first type of lines;
a single line of the second type of line is an only line separating two adjacent first type of lines; and
the single line of the second type of line has a top surface on a plane offset from each of the top surfaces of the plurality of first type of lines.

12. The semiconductor structure of claim 11, further comprising:
a plurality of first vias connecting each of the plurality of first type of lines and the second type of line to one of a plurality of through-silicon vias, wherein the second type line with the wider top surface than the line bottom surface has a different height than the plurality of first type of lines; and
a plurality of second vias connecting each of the plurality of first type of lines and the second type of line to a second backside metal level.

13. The semiconductor structure of claim 11, further comprising:
a plurality of first vias connecting each of the plurality of first type of lines and the second type of line to a second metal level closer to a backside of a semiconductor substrate than the first metal level; and
a plurality of second vias connecting each of the plurality of first type of lines and the second type of line to a third backside metal level under the first backside metal level, wherein the second type of line has a top surface that is below a top surface of the plurality of first type of lines.

14. A semiconductor structure comprising:
a plurality of first type of lines with a first line width in a first front side metal level, wherein each of the plurality of first type of lines have a wider top surface than a bottom surface;
a second type of line with a second line width that is wider than the first line width, wherein each of the second type of line is between adjacent first type of lines; and
a plurality of first vias connecting: (i) each of the plurality of first type of lines and (ii) the second type of line, to a second front side metal level.

15. The semiconductor structure of claim 14, wherein:
the second type of line is shorter than the plurality of first type of lines; and
the second type of line is above a bottom surface of the plurality of first type of lines.

16. The semiconductor structure of claim 14, wherein the second type of line each connect by one via of a plurality of second vias to an element from the group consisting of: (i) a semiconductor device and (ii) a metal level that is under the first metal level.

17. The semiconductor structure of claim 16, further comprising:

the second type of line each connect by one of the plurality of second vias to a semiconductor device of a plurality of semiconductor devices;

the semiconductor device of the plurality of semiconductor devices connects by a through-silicon via to a third via under a backside of a semiconductor substrate; and the third via connects to a backside second type of line in a first backside metal level.

18. The semiconductor structure of claim 14, further comprising:

a third front side metal level above the second front side metal level including a second plurality of first type of lines and another second type of line between two adjacent first type of lines of the second plurality of first type of lines.

19. The semiconductor structure of claim 14, wherein:

the second type of line includes more than one of the second type of line; and each of the more than one of the second type of line is selected from the group of second type of lines consisting of: has a top surface that is above the top surface of the plurality of first type of lines, has a top surface that is level with a middle portion of the plurality of first type of lines, and has a top surface that is level with the top surface of the plurality of first type of lines.

20. The semiconductor structure of claim 14, wherein the first front side metal level is a metal level selected from the group consisting of: a middle-of-line metal level and a back-end-of-line metal level.

21. A semiconductor structure comprising:

a plurality of first type of lines in a first front side metal level with a first type of line width;

a second type of line in the first front side metal level with a second line width that is less than the first type of line width, wherein a single line of the second type of line is an only line separating two adjacent first type of lines of the plurality of first type of lines;

a plurality of first vias connecting a plurality of semiconductor devices to lines in the first front side metal level;

a plurality of through-silicon vias in a semiconductor substrate, wherein each of the plurality of through-silicon vias connect of the plurality of semiconductor devices to a plurality of second vias in a first dielectric layer on a backside of the semiconductor substrate;

a plurality of backside first type of lines in a first backside metal level with a third line width, wherein each of the plurality of backside first type of lines contact to one of the plurality of second vias;

a backside second type of line in the first backside metal level with a fourth line width that is narrower than the third line width, wherein:

the backside second type line is between two adjacent lines of the plurality of backside first type of lines; and the backside second type of line contacts one via of the plurality of second vias; and a plurality of third vias connecting the backside second type of line and the plurality of backside first type of lines to a second backside metal level.

22. The semiconductor structure of claim 21, wherein the backside second type of line has a same height as the plurality of backside first type of lines.

23. The semiconductor structure of claim 21, wherein the backside second type of line has a top surface with a level that is selected from the group consisting of: a lower level than a top surface of the plurality of backside first type of lines, a same level as a middle portion of the plurality of backside first type of lines, and a higher level than the top surface of the plurality of backside first type of lines.

24. A method comprising:

forming a plurality of first vias in a first dielectric material on a backside of semiconductor substrate using a damascene process;

etching two first trenches for two first type of lines over a via of the plurality of first vias using the damascene process;

depositing a metal material in the two first trenches;

performing a chemical mechanical polish (CMP);

subsequent to depositing the metal material in the first two trenches, etching a third trench between the two first type of lines using a damascene process, wherein the third trench is narrower than the two first trenches;

filling the third trench with the metal material; and performing CMP to form a second type line.

25. The method of claim 24, wherein the metal material in the two first trenches and the metal material filling the third trench are different metal materials.

* * * * *